(12) United States Patent
Shirakawa

(10) Patent No.: US 6,176,011 B1
(45) Date of Patent: Jan. 23, 2001

(54) ELECTRONIC PARTS SUPPLYING DEVICE AND ELECTRONIC PARTS MOUNTING METHOD

(75) Inventor: Tokio Shirakawa, Kofu (JP)

(73) Assignee: Matsushita Electric Industrial Co., Ltd., Osaka (JP)

(*) Notice: Under 35 U.S.C. 154(b), the term of this patent shall be extended for 0 days.

(21) Appl. No.: 09/242,447

(22) PCT Filed: Aug. 7, 1997

(86) PCT No.: PCT/JP97/02744

§ 371 Date: Feb. 17, 1999

§ 102(e) Date: Feb. 17, 1999

(87) PCT Pub. No.: WO98/08367

PCT Pub. Date: Feb. 26, 1998

(30) Foreign Application Priority Data

Aug. 19, 1996 (JP) .................................... 8-217177

(51) Int. Cl.$^7$ .................................................. H05K 3/30
(52) U.S. Cl. ................ 29/832; 29/740; 29/759; 29/834
(58) Field of Search .................. 29/740, 834, 759, 29/832

(56) References Cited

U.S. PATENT DOCUMENTS

| | | |
|---|---|---|
| 4,501,064 | 2/1985 | DiNozzi et al. . |
| 5,153,983 * | 10/1992 | Oyama ................................. 29/740 |
| 5,342,460 * | 8/1994 | Hidese ................................. 29/834 |
| 5,456,001 * | 10/1995 | Mori et al. ............................ 29/740 |
| 5,671,530 * | 9/1997 | Combs et al. ........................ 29/834 |
| 5,727,311 * | 3/1998 | Ida et al. .............................. 29/740 |
| 5,740,604 * | 4/1998 | Kitamura et al. .................... 29/740 |
| 5,743,005 * | 4/1998 | Nakao et al. ......................... 29/740 |
| 5,778,525 * | 7/1998 | Hata et al. ............................ 29/740 |
| 5,839,187 * | 11/1998 | Sato et al. ............................ 29/759 |
| 5,855,059 * | 1/1999 | Togami et al. ....................... 29/740 |
| 5,894,657 * | 4/1999 | Kanayama et al. .................. 29/740 |

FOREIGN PATENT DOCUMENTS

| | | |
|---|---|---|
| 60-242700 | 12/1985 | (JP) . |
| 1-30298 | 2/1989 | (JP) . |
| 98/36629 | 8/1998 | (WO) . |

OTHER PUBLICATIONS

Database WPI, Section PO, Week 9728, Derwent Publications Ltd., London, GB; AN 97–310918, XP002115442 & WO 97 20455 A (Matsushita Denki Sangyo KK Matsushita Electric Ind Co Ltd), May 6, 1997 *abstract*.

* cited by examiner

*Primary Examiner*—Carl J. Arbes
(74) *Attorney, Agent, or Firm*—Wenderoth, Lind & Ponack, L.L.P.

(57) ABSTRACT

An electronic component taken out from a component storage section by a transfer head is held by suction, transferred and inspected as to whether it is good or defective by a good/defective component inspecting device. Thereafter, the electronic component is delivered to an alignment suction nozzle on a component alignment section. The sequence of the above-operations is then repeated, whereby the electronic components inspected and then aligned in the order of mounting can be supplied to a mounting head. Therefore, a mount time for the electronic components in a mount process is greatly shortened, so that productivity is expected to be improved. The electronic components can also be inspected before being aligned in the order of mounting, which further enhances mount efficiency.

13 Claims, 3 Drawing Sheets

ELECTRONIC PARTS SUPPLYING DEVICE AND ELECTRONIC PARTS MOUNTING METHOD

TECHNICAL FIELD

The present invention relates to an electronic component-feeding apparatus and an electronic component mount method used in mounting electronic components to circuit boards.

BACKGROUND ART

FIG. 3 is a diagram showing a constitution of a conventional electronic component-mounting apparatus. A component storage section 3 storing required electronic components 2 is selected from a component storage device 1 which stores several tens of component storage sections 3, and the storage section 3 is sent out in a direction of an arrow I. A mounting head 10 moving freely in X-axis and Y-axis directions sucks components 2 to thereby hold and transfer the electronic components 2. A sucked position of the electronic component 2 is first detected by a position detection camera 7, and thereafter an accuracy of clinched leads of the component or the like is inspected by a good/defective component inspecting device 6. Whether the electronic component 2 is good or fails is thus determined and if the electronic component 2 is defective, the electronic component 2 is removed. A suction attitude and a mount position of the electronic component 2 judged to be good are corrected on the basis of information of the sucked position obtained by the position detection camera 7. The electronic component 2 is then mounted to a circuit board 11. A plurality of tape-type component feeding devices 12 feeding components stored in a tape, etc. are arranged at an opposite side of the component storage device 1 via a transfer path for the circuit board 11, so that the other components to be mounted to the circuit board 11 are properly supplied and mounted to the circuit board 11 with the use of the aforementioned mounting head 10.

In the prior art constitution as above, a sequence of processes takes time, i.e., a process wherein the component storage device selects the required component storage section, moves the storage section up/down and sends out the storage section through a take-out opening, a process wherein a transfer head sucks the components to thereby hold and transfer the predetermined electronic component, a process wherein the sucked position of the component is detected and corrected so as to inspect whether the component is good or defective, and a process of mounting the component to the circuit board. Productivity efficiency is yet to be solved.

The present invention has for its object to provide an electronic component-feeding apparatus and electronic component mount method of improved efficiency.

SUMMARY OF THE INVENTION

In solving the above-discussed disadvantage, according to a first aspect of the present invention, there is provided an electronic component-feeding apparatus which comprises component storage sections, a component storage device, transfer head, a component alignment section, and an inspection device.

The component storage sections store electronic components. The component storage device has a plurality of the component storage sections therein, and selects and sends out a desired component storage section therefrom.

The transfer head has a suction nozzle for sucking a predetermined electronic component from the component storage section selected and sent out by the component storage device, thereby transferring the predetermined electronic component to a component alignment section.

The component alignment section holds the electronic components sequentially transferred by the transfer head, and transfers the held electronic components sequentially to a suction position of a mounting head.

The inspecting device is for inspecting whether the electronic component is good or defective on a transfer path of the transfer head. By the above construction of the aspect of the present invention, the electronic components can be aligned in the order of mounting at the component alignment section at the same time that a circuit board is carried in or discharged. Therefore, the electronic components are efficiently supplied to the mounting head when the electronic components are mounted to the circuit board. Thus, efficiency in mounting the electronic components is improved greatly. In addition to this effect, the electronic components can be inspected before being supplied to the mounting head. Thus, efficiency is furthermore enhanced.

According to a second aspect of the present invention, the component alignment section of the first aspect of the present invention includes a component alignment belt and alignment suction nozzles arranged in a row at a constant interval on the component alignment belt along a transfer direction of the component alignment belt. Therefore, the electronic components are supplied sequentially to the mounting head through an intermittent operation of the component alignment belt. By the above construction, the electronic components can accordingly be efficiently and surely supplied to the mounting head in a state while aligned in the order of mounting.

According to a third aspect of the present invention, in the electronic component-feeding apparatus in the first or second aspect of the present invention, the transfer direction of the component alignment belt of the component alignment section is oriented in parallel to a direction in which the selected component storage section is sent out from the component storage device. In addition, the transfer head moves in a direction orthogonal to the sendout direction. By the above construction, the electronic components can be aligned on the component alignment section efficiently in the order of mounting through a reciprocatory operation of the transfer head.

According to a fourth aspect of the present invention, an electronic component mount method carried out when electronic components are mounted to a circuit board is provided. This method comprises selecting a desired one of a plurality of component storage sections storing the electronic components, and taking out the electronic component selected among the electronic components in the selected component storage section on the basis of the order of mounting to the circuit board. The electronic component is then transferred and delivered to a component alignment section. The selecting, taking out, transferring and delivering operations are repeated in accordance with the order of mounting. The electronic components sequentially transferred to the component alignment section are held and the held electronic components are supplied sequentially to a suction position of a mounting head by the component alignment section.

The electronic components are then sucked sequentially at the suction position and are mounted to the circuit board by the mounting head. By the above constructions, the electronic components can be efficiently supplied to the mounting head in a state while aligned in the order of mounting at the same time that the circuit board is carried in or out. In consequence, the electronic components are mounted efficiently to the circuit board.

According to a fifth aspect of the present invention, while the electronic component is being transferred to the component alignment section, the electronic component is inspected to determine whether it is good or not. By the above constructions, whether or not the electronic component is good is determined before it is supplied to the mounting head, thereby enhancing efficiency.

According to a sixth aspect of the present invention, in any one of the first through third aspects of the present invention, the transfer head repeatedly takes out the electronic components in accordance with the order in which they are mounted to the circuit board. The transfer head also repeatedly transfers the electronic component to the component alignment section and delivering the electronic component to the component alignment section in the order in which they are to be mounted. The electronic components can accordingly be delivered to the component alignment section among the electronic components in the component storage section in accordance with the order of mounting to the circuit board.

As described hereinabove, in the electronic component-feeding apparatus and the electronic component mount method provided according to the present invention, the time during which the circuit board is carried in or out, etc. is efficiently utilized to feed the electronic components to the mounting head in a state while the electronic components are aligned in the order of mounting. A mount time for the electronic components in a mount process is consequently greatly reduced, and productivity is expected to be improved. Moreover, the good/defective inspection of the electronic components can be accomplished before they are aligned in the order of mounting, achieving further improvement in efficiency.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
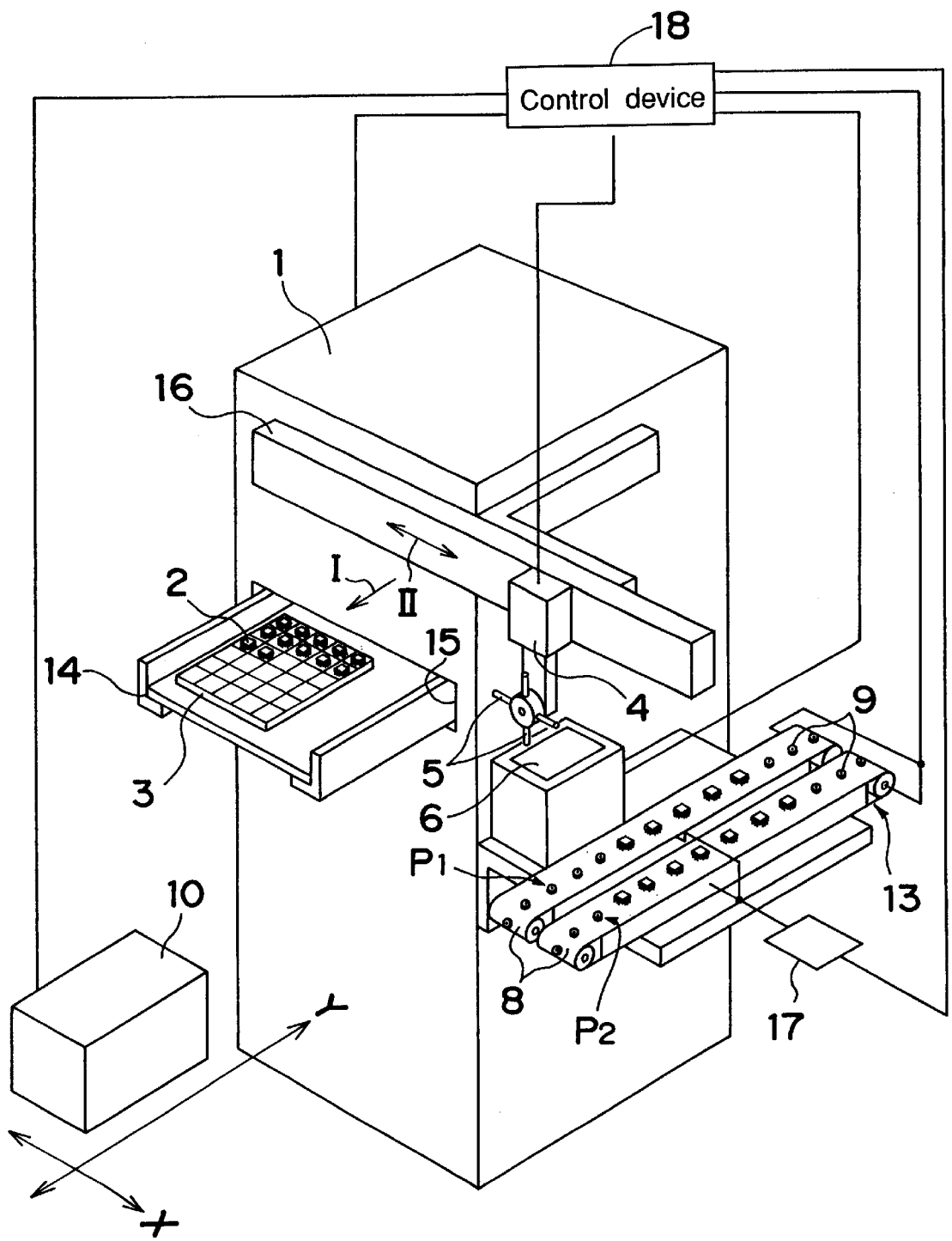
FIG. 1 is a perspective view of an electronic component-feeding apparatus in an embodiment of the present invention

Before the description of the present invention proceeds, it is to be noted that like parts are designated by like reference numerals throughout the accompanying drawings.

Preferred embodiments of the present invention will be described hereinbelow with reference to FIGS. 1 and 2 in which the same members as in the conventional art are designated by the same reference numerals.

In FIG. 1, a component storage device 1 holds several tens of component storage sections 3 such as trays or the like storing electronic components 2 therein. The layered storage sections 3 are held in the device 1 in a manner so as to be movable up and down. The component storage section 3 storing a required electronic component is designated according to a program, and then is moved up and down and carried to a take-out opening 15 by moving up and down a component storage section-supporting shelf 14 supporting the component storage section 3. The component storage section 3 is discharged out in a direction of an arrow I through the take-out opening 15. A transfer head 4 having several kinds of transfer suction nozzles 5 takes out the electronic component 2 from the component storage section 3 by using an optimum nozzle conforming to a type of the electronic component 2, transfers the electronic component in a direction of an arrow II along a guide rail 16, and passes the electronic component over a good/defective component-inspecting device 6 arranged at a location corresponding to a transfer path of the electronic component so as to inspect whether the electronic component is good or defective. The electronic component 2 is moved to a component alignment section 13 when the component is good, whereas a defective electronic component 2 is eliminated by a removing means (not shown in the drawing). The good/defective component-inspecting device 6 scans the electronic component 2 with laser light in a direction orthogonal to the arrow direction II when the electronic component 2 transferred in the direction II passes over the inspecting device 6. Thus inspections are conducted on the following inspection items on the basis of a light receptive position and a light-receptive amount of a reflected laser light of the scan. The inspection items referred to above include a lead pitch, a lead count, a lead bend in a thicknesswise direction of the electronic component in the case of the electronic component 2 having leads. For the electronic component 2 with solder balls or bumps, the inspection items include a lack or break, a height and a shape of the solder ball or bump. Inspection information from the inspecting device 6 is supplied to a control device 18 which judges whether the electronic component 2 is good or defective.

The component alignment section 13 has two component alignment belts 8. A plurality of alignment suction nozzles 9 are arranged at a constant interval on each component alignment belt 8. So, the component alignment section 13 sends the electronic components 2 to suction positions P1, P2 of a mounting head 10 sequentially through an intermittent driving via a constant pitch by the alignment belts 8. A suction device 17 is connected to each component alignment belt 8. The alignment suction nozzles 9 suck the components 2 to thereby hold the electronic components 2 by the suction device 17.

The control device 18 controls the abovedescribed operations of at least the component storage device 1, transfer head 4, good/defective component inspecting device 6, mounting head 10, component alignment section 13 and suction device 17. The control device 18 can also control operations of a position detection camera 7 and a transference of the circuit board 11 as described later. A mount program contain information regarding a relationship of mount positions on the circuit board including the order of mounting, containing information about the types of the electronic components to be mounted at the mount positions, and containing information related to a mount operation such as types of electronic components stored in the component storage sections 3, etc. are stored in the control device 18 before the mounting is started.

Figure 2:
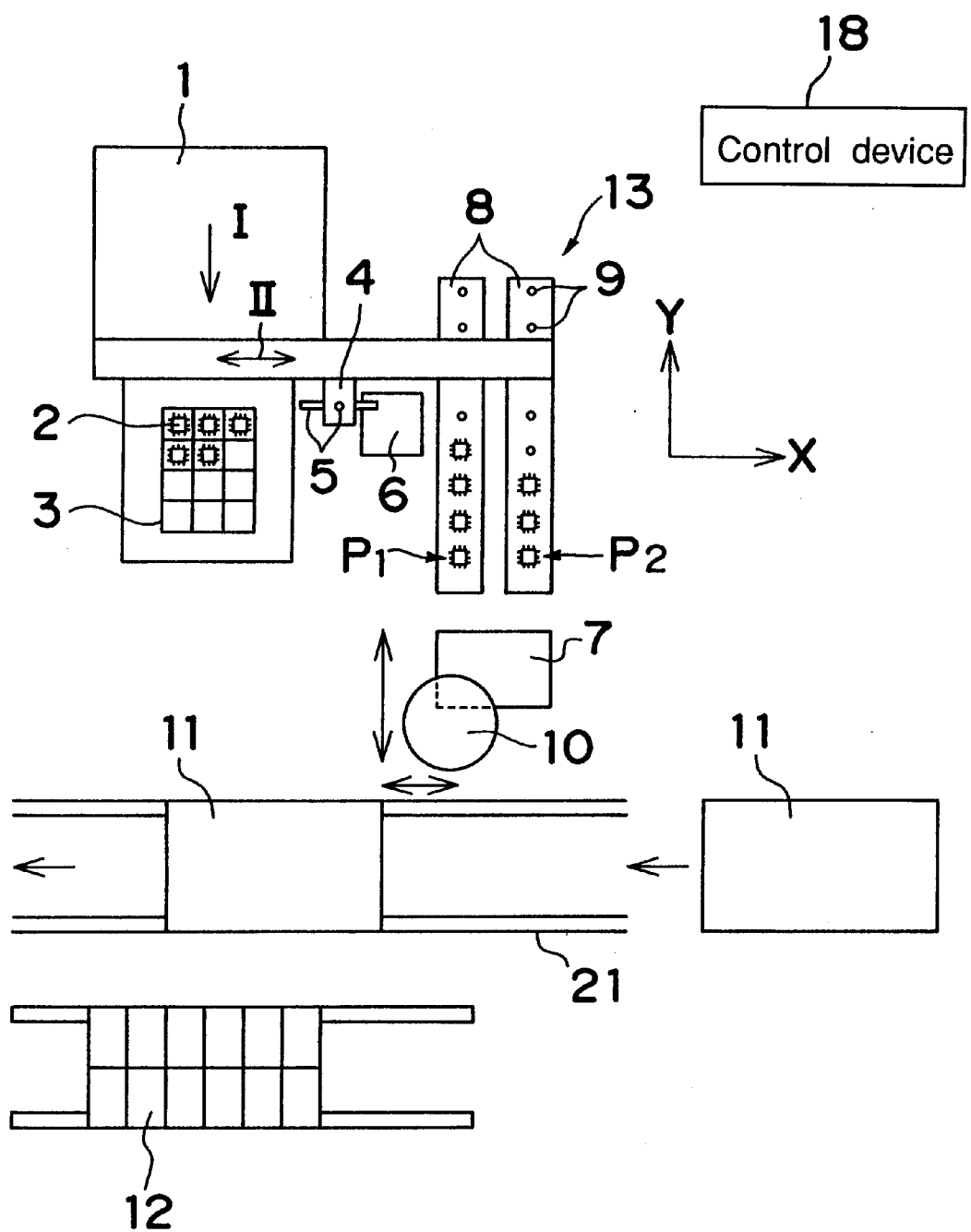
FIG. 2 is diagram of the constitution of an electronic component-mounting apparatus according to an embodiment of the present invention which includes the electronic component-feeding apparatus of FIG. 1.
Figure 3:
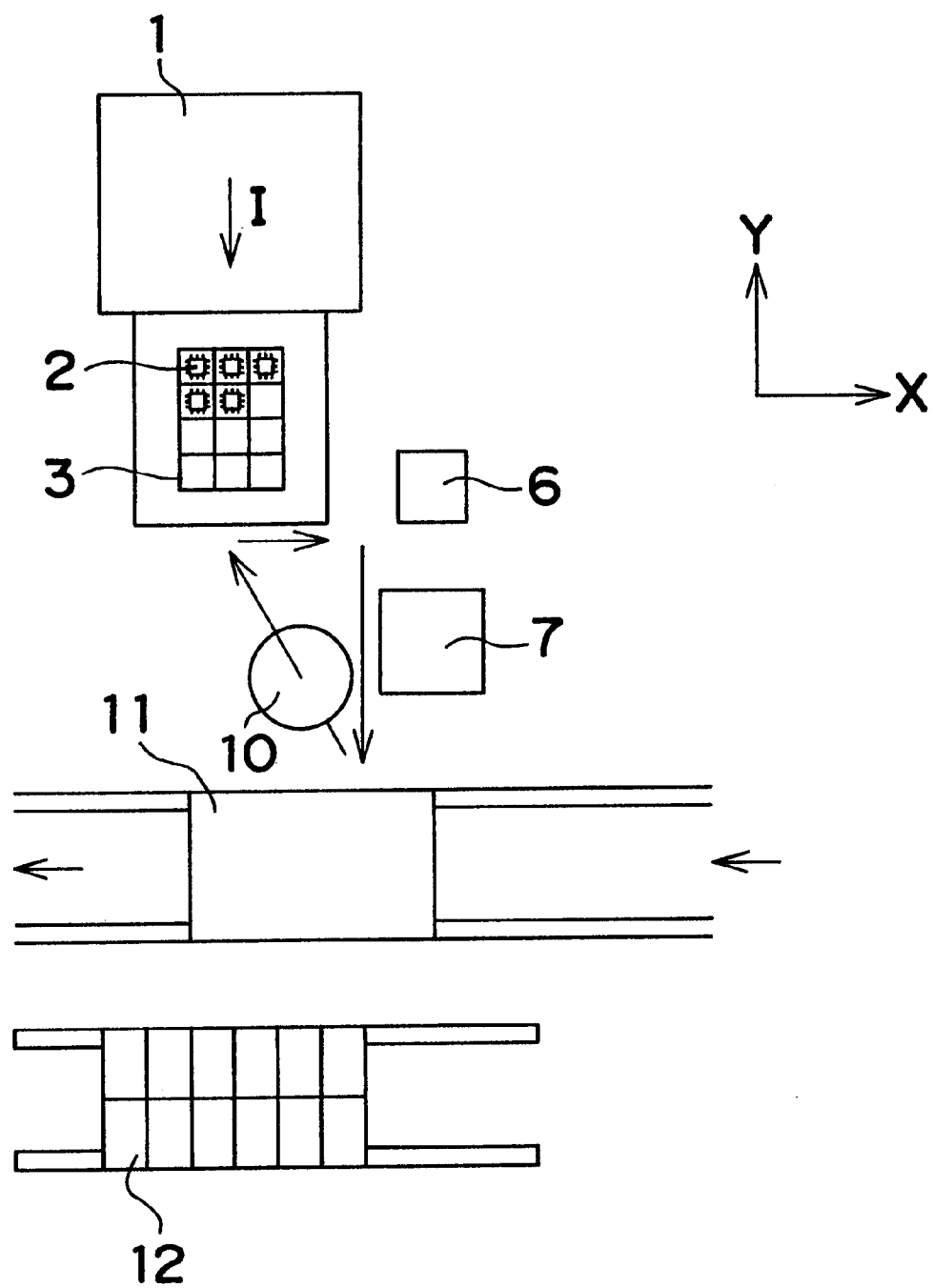
FIG. 3 is a diagram of the constitution of a conventional electronic component-mounting apparatus.

FIG. 2 is a diagram showing the constitution of an electronic component-mounting apparatus in an embodiment of the present invention including the electronic component-feeding apparatus 12 is a tape-type or stick-type component feeding apparatus. The component storage device 1 is set at the opposite side to the feeding apparatus 12 via a circuit board feed path 21. The component alignment section 13 is arranged in parallel to the component storage device 1, and the good/defective component-inspecting device 6 is positioned between the component storage section 3 and the component alignment belt 8. The position detection camera 7 for correction of the component sucked position is placed between the component alignment belts 8 and circuit board 11. During the time when the circuit board 11 is moved out after a component has been mounted thereto and a fresh circuit board 11 is carried in, or when the mounting head 10 mounts a different electronic component supplied from the tape-type or stick-type component feeding apparatus 12 to the circuit board 11, the transfer head 4 takes out an electronic component 2 from the component-storage section 3. The electronic component 2 is then inspected by the good/defective component-inspecting device 6 installed in the middle of the transfer path, and if the electronic component 2 is good, the transfer head 4 transfers the electronic component 2 to the alignment suction nozzle 9 on the alignment belt 8. The above operation is repeatedly carried out for a predetermined number of times. Thus after the inspection, the electronic components 2 can be aligned sequentially on the component alignment belts 8 in the programmed order of mounting, and can be sucked and held by the alignment suction nozzles 9. Through the intermittent feeding by the component alignment belts 8, the electronic components 2 are sent towards the mounting head 10 by every one pitch. Therefore, in this constitution, the time for carrying in and out the circuit board 11 can be utilized efficiently, and the mounting head 10 merely reciprocates between a leading end of the alignment belts 8 at the side of the mounting head 10 and the circuit board 11. As a result, an increase in speed of the mounting operation is achieved.

According to the above arrangement, even in the case of electronic components of a large size requiring that the component storage device have trays layered therein, a predetermined electronic component can be taken out, transferred and mounted in short time. Therefore, the large electronic components can be supplied efficiently in the same manner as in the tape-type or stick-type component feeding apparatus.

Although the component alignment section uses two component alignment belts in the above description, one component alignment belt or two or more belts can act in the same way.

In the embodiment, the good/defective component inspecting device is located between the component storage device and component alignment belt. However, the arrangement is not required. For instance, the inspecting device may be set at the component alignment section.

Further, the tape-type or stick-type component feeding apparatus is employed together in the embodiment. However the electronic component-feeding apparatus of the present invention may be used singly in the electronic component-mounting apparatus, which fulfills the same effect.

The mounting head adopted in the embodiment moves in the X-axis and Y-axis directions other kinds of mounting heads (e.g., a rotary head and the like) are applicable to the electronic component-feeding apparatus of the present invention.

The entire disclosure of Japanese Patent Application No. 8-217177 filed on Aug. 19, 1996 including the specification, claims, drawings and summary is incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of mounting electronic components to a circuit board, comprising:

selecting a desired one of a plurality of component storage sections housed in a component storage device, each of the component storage sections storing electronic components;

ejecting the desired one of the component storage sections from the component storage device;

sucking a predetermined electronic component from the desired one of the component storage sections using a transfer head;

transferring the sucked electronic component to a component alignment section using the transfer head;

inspecting the sucked electronic component during transfer of the sucked electronic component to the component alignment section so as to determine whether the sucked electronic component is defective;

placing the transferred and inspected electronic component onto the component alignment section;

repeating said sucking of a predetermined electronic component, said transferring of the sucked electronic component, said inspecting of the sucked electronic component, and said placing of the transferred and inspected electronic component so as to form an alignment of electronic components along the component alignment section;

holding the alignment of electronic components on the component alignment section;

conveying the held alignment of electronic components to a suction position of a mounting head using the component alignment section;

sequentially sucking the alignment of electronic components from the component alignment section using a mounting head; and mounting the sequentially sucked alignment of electronic components onto a circuit board.

2. The method of claim 1, wherein the component alignment section comprises at least one component alignment belt, and the component alignment section comprises alignment suction nozzles on the at least one component alignment belt, the alignment suction nozzles being arranged in a row and spaced at constant intervals along a transfer direction of the at least one component alignment belt, said conveying of the held alignment of electronic components comprising intermittently rolling the at least one component alignment belt so as to sequentially supply the held electronic components to said mounting head.

3. The method of claim 2, wherein said transferring of the sucked electronic component comprises transferring the sucked electronic component along a transfer path, said conveying of the held alignment of electronic components comprises conveying the held alignment in a transfer direction, and said ejecting of the desired one of the component storage sections comprises ejecting the desired one of the component storage sections in an ejection direction, the transfer direction being parallel to the ejection direction, and the transfer path being orthogonal to the ejection direction.

4. The method of claim 1, wherein said transferring of the sucked electronic component comprises transferring the sucked electronic component along a transfer path, said conveying of the held alignment of electronic components comprises conveying the held alignment in a transfer direction, and said ejecting of the desired one of the component storage sections comprises ejecting the desired one of the component storage sections in an ejection direction, the transfer direction being parallel to the ejection direction, and the transfer path being orthogonal to the ejection direction.

5. The method of claim 1, wherein said holding of the alignment of electronic components comprises sucking the electronic components onto the component alignment section.

6. An electronic component-feeding apparatus comprising:
a component storage device housing a plurality of component storage sections for storing electronic components, said component storage device being operable to select and eject a desired one of said component storage sections;
a transfer head having a suction nozzle for sucking a predetermined electronic component from the selected and ejected one of said component storage sections;
a component alignment section, said transfer head being operable to transfer the sucked electronic component along a transfer path to said component alignment section, said component alignment section being operable to hold the transferred electronic component in a predetermined alignment;
an inspection device disposed along said transfer path for inspecting the sucked electronic component as the sucked electronic component is transferred by said transfer head so as to determine whether the sucked electronic component is a defective electronic component; and
a mounting head, said component alignment section being operable to convey the held electronic components to a suction position of said mounting head.

7. The apparatus of claim 6, wherein said component alignment section comprises at least one component alignment belt, and said component alignment section comprises alignment suction nozzles on said at least one component alignment belt, said alignment suction nozzles being arranged in a row and spaced at constant intervals along a transfer direction of said at least one component alignment belt, said component alignment section being adapted to intermittently operate so as to sequentially supply the held electronic components to said mounting head.

8. The apparatus of claim 7, wherein each of said component storage sections comprises a tray for storing the electronic components, said tray of each of said component storage sections being formed into a lattice shape.

9. The apparatus of claim 7, wherein said component alignment section is oriented such that said transfer direction of said at least one component alignment belt is parallel to an ejection direction of the selected and ejected one of said component storage sections, and wherein said transfer path is orthogonal to said ejection direction of the selected and ejected one of said component storage sections.

10. The apparatus of claim 9, wherein each of said component storage sections comprises a tray for storing the electronic components, said tray of each of said component storage sections being formed into a lattice shape.

11. The apparatus of claim 6, wherein each of said component storage sections comprises a tray for storing the electronic components, said tray of each of said component storage sections being formed into a lattice shape.

12. The apparatus of claim 6, wherein said component alignment section is operable to transfer the held electronic components along a transfer direction, said component alignment section being oriented such that said transfer direction is parallel to an ejection direction of the selected and ejected one of said component storage sections, and said transfer path being orthogonal to said ejection direction of the selected and ejected one of said component storage sections.

13. The apparatus of claim 12, wherein each of said component storage sections comprises a tray for storing the electronic components, said tray of each of said component storage sections being formed into a lattice shape.

* * * * *